(12) United States Patent
Kawarai et al.

(10) Patent No.: US 9,167,682 B2
(45) Date of Patent: Oct. 20, 2015

(54) ELECTRONIC COMPONENT WITH COIL, METHOD FOR MANUFACTURING THE SAME AND POWER SUPPLY MODULE

(71) Applicant: SUMIDA Corporation, Tokyo (JP)

(72) Inventors: Mitsugu Kawarai, Tokyo (JP); Douglas James Malcolm, Kingston (CA)

(73) Assignee: Sumida Corporation (JP)

( * ) Notice: Subject to any disclaimer, the term of this patent is extended or adjusted under 35 U.S.C. 154(b) by 233 days.

(21) Appl. No.: 13/972,271

(22) Filed: Aug. 21, 2013

(65) Prior Publication Data

US 2015/0055311 A1 Feb. 26, 2015

(51) Int. Cl.
*H05K 7/00* (2006.01)
*H05K 1/02* (2006.01)
*H05K 3/30* (2006.01)
*H05K 1/09* (2006.01)
*H05K 1/18* (2006.01)

(52) U.S. Cl.
CPC ............ *H05K 1/0215* (2013.01); *H05K 1/0233* (2013.01); *H05K 1/09* (2013.01); *H05K 1/181* (2013.01); *H05K 3/30* (2013.01); *H05K 2201/086* (2013.01); *H05K 2203/1316* (2013.01)

(58) Field of Classification Search
USPC .......................................... 361/782; 174/258
See application file for complete search history.

(56) References Cited

U.S. PATENT DOCUMENTS

| 8,730,001 B2 * | 5/2014 | Yoshikawa et al. ............ 336/221 |
| 2009/0231078 A1 * | 9/2009 | Watanabe ...................... 336/192 |

* cited by examiner

*Primary Examiner* — Andargie M Aychillhum
(74) *Attorney, Agent, or Firm* — Harness, Dickey & Pierce, P.L.C.

(57) ABSTRACT

An electronic component includes a circuit board that includes a ground terminal connected to a ground potential, a coil component that is assembled on the circuit board, the coil component includes a T-shaped core and an air-core coil, a ground connection electrode that is assembled on the circuit board next to the coil component and that is connected to the ground terminal, and a mixture of a metal composite magnetic material and a resin that is formed on the circuit board and that covers the coil component and the ground connection electrode as a package. A part of the ground connection electrode is exposed outside the mixture.

12 Claims, 11 Drawing Sheets

ELECTRONIC COMPONENT WITH COIL, METHOD FOR MANUFACTURING THE SAME AND POWER SUPPLY MODULE

BACKGROUND

The present disclosure relates to an electronic component with a coil, a method for manufacturing the electronic component, and a power supply module. Specifically, the electronic component and the power supply module may have a coil component, such as an inductor element, surrounded by a metal composite magnetic material.

In the field of electronic components, it is well known to manufacture a coil component having a dust core (an air-coil core) by a press machine. According to this method, the press machine presses a mixture of magnetic powder and resin to seal a coil therewithin. This produces what is commonly referred to as a sealed coil-type magnetic component. Japanese Patent Publication Number JP 2007-81306 discloses a sealed coil-type magnetic component. The sealed coil-type magnetic component is configured with an air-core coil and a magnetic body. The magnetic body is made of a magnetic powder and resin mixture which seals the air-core coil. After the mixture is put in a metal mold of a press machine, the air-core coil is placed on the mixture. Thereafter, additional mixture is added over the air-core coil until the metal mold is filled. Next, upper and lower punches of the press machine press the mixture in the metal mold with a pressure of 3-5 ton/cm$^2$.

Unfortunately, because the sealed coil-type magnetic component is formed under high pressure, the air-core coil may be deformed or broken. As such, the manufacturing yield decreases.

In the field of electronic components, it is also well known to manufacture a power supply module by injecting a thermoplastic resin. Such a power supply module is often configured with passive components such as a coil, a resistor and a capacitor, and an IC that are assembled on a circuit board. Japanese Utility Model Publication Number JPU H05-38994 discloses a method of manufacturing one such power supply module. According to the disclosed method, after an electronic component is assembled on a metal board, thermoplastic resin is injected on and around the electronic component. Then, the thermoplastic resin is hardened. However, because the magnetic permeability of the thermoplastic resin is quite low, an electromagnetic wave generated at the electric component (i.e., the coil) is transferred to other areas inside the power supply device but outside the power supply module. Therefore, electromagnetic interference may occur.

SUMMARY

In view of the above, a new method for manufacturing an electronic component is provided. The method includes placing a T-shaped core and an air-core coil in a metal mold, injecting a mixture of a metal composite magnetic material and a resin into the metal mold so that the T-shaped core and the air-core coil are embedded by the mixture, heating the mixture at a first temperature, hardening the mixture, and polishing an outside of the hardened mixture.

The above could provide a method for manufacturing an electronic component, such as a power supply module, a coil component and an inductor element, with a high yield in which electromagnetic interference does not occur. However, in some circumstances, static electricity, which is created during manufacturing, assembling, handling or transportation of a component, causes insulation (electric) breakdown between the coil and a surface of the electric component. Specifically, an insulation resistance between the coil and the surface of the electric component decreases to several kΩ from about 100 MΩ that is in an ideal condition.

Thus, an object of the present disclosure is to provide an electronic component with a coil, a method for manufacturing the electronic component, and a power supply module that have a superior property against static electricity.

To address the above problems, an electronic component according to an aspect of the present disclosure includes: a circuit board that includes a ground terminal connected to a ground potential; a coil component that is assembled on the circuit board, the coil component includes a T-shaped core and an air-core coil; a ground connection electrode that is assembled on the circuit board next to the coil component and that is connected to the ground terminal; and a mixture of a metal composite magnetic material and a resin that is formed on the circuit board and that covers the coil component and the ground connection electrode as a package. A part of the ground connection electrode is exposed outside the mixture.

In the electronic component according to another aspect of the present disclosure, the ground connection electrode is in a bar shape. A tip of the ground connection electrode is exposed outside the mixture.

In the electronic component according to another aspect of the present disclosure, another ground connection electrode is assembled on the circuit board next to the coil component. The another ground connection electrode is connected to the ground terminal. The another ground connection electrode is in the bar shape. A tip of the another ground connection electrode is exposed outside the mixture.

In the electronic component according to another aspect of the present disclosure, the ground connection electrode is in a rectangular arch shape. One of a top and a side of the ground connection electrode is exposed outside the mixture.

In the electronic component according to another aspect of the present disclosure, another ground connection electrode is assembled on the circuit board next to the coil component. The another ground connection electrode is connected to the ground terminal. The another ground connection electrode is in the rectangular arch shape. One of a top and a side of the another ground connection electrode is exposed outside the mixture.

In the electronic component according to another aspect of the present disclosure, the circuit board is formed by a plurality of board layers. The ground terminal is provided on one of the plurality of board layers that faces another of the plurality of board layers.

A method for manufacturing an electronic component according to an aspect of the present disclosure includes placing a T-shaped core, an air-core coil and a ground connection electrode, which are assembled on a circuit board having a ground terminal connected to a ground potential, in a metal mold, the ground connection electrode being located next to the air-core coil and being connected to the ground potential, injecting a mixture of a metal composite magnetic material and a resin into the metal mold so that the T-shaped core and the air-core coil are embedded by the mixture, heating the mixture at a first temperature, hardening the mixture, and polishing an outside of the hardened mixture. A part of the ground connection electrode is exposed outside the mixture.

In the method for manufacturing an electronic component according to another aspect of the present disclosure, the method further includes applying a pressure of 0.1 to 20.0 kg/cm² to the mixture for adjusting an outer shape of the mixture by a movable punch of a press machine before the hardening process.

In the method for manufacturing an electronic component according to another aspect of the present disclosure, the method further includes removing excessive mixture from a top surface of the mixture by a sharp edge of a remover before the heating is performed.

In the method for manufacturing an electronic component according to another aspect of the present disclosure, the sharp edge of the remover slides along the top surface of the mixture with an angle of 0 to 20 degrees with respect to the top surface and while applying a pressure of 0.1 to 20.0 kg/cm² to the mixture.

In the method for manufacturing an electronic component according to yet another aspect of the present disclosure, the injecting process is performed by a dispenser that includes a discharge opening that discharges the mixture, a material tank that stores a material for the mixture, a flow passage through which the material flows, a valve that is provided in the flow passage and controls a flow of the material, a valve driving unit that opens and closes the valve, and a mixer that is provided at a trailing end of the flow passage and that mixes the material with another material to form the mixture, and supplies the mixture toward the discharge opening.

In the method for manufacturing an electronic component according to yet another aspect of the present disclosure, the injecting process is performed by a dispenser that includes a discharge opening that discharges the mixture, a material tank that stores the mixture, a flow passage through which the mixture flows, a valve that is provided in the flow passage and controls a flow of the mixture, a valve driving unit that opens and closes the valve, and a mixer that is provided at a trailing end of the flow passage and that mixes the mixture, and supplies the mixture toward the discharge opening.

A power supply module according to an aspect of the present disclosure includes: a circuit board that includes a ground terminal connected to a ground potential; a coil component that is assembled on the circuit board, the coil component includes a T-shaped core and an air-core coil; passive components including a capacitor and a resistor that are assembled on the circuit board; an integrated circuit that is assembled on the circuit board; a ground connection electrode that is assembled on the circuit board next to the coil component and that is connected to the ground terminal; and a mixture of a metal composite magnetic material and a resin that is formed on the circuit board and that covers the coil component, the passive components, the integrated circuit and the ground connection electrode as a package. A part of the ground connection electrode is exposed outside the mixture.

In the power supply module according to another aspect of the present disclosure, the ground connection electrode is in a bar shape. A tip of the ground connection electrode is exposed outside the mixture.

In the power supply module according to another aspect of the present disclosure, another ground connection electrode is assembled on the circuit board next to the coil component. The another ground connection electrode is connected to the ground terminal. The another ground connection electrode is in the bar shape. A tip of the another ground connection electrode is exposed outside the mixture.

In the power supply module according to another aspect of the present disclosure, the ground connection electrode is in a rectangular arch shape. One of a top and a side of the ground connection electrode is exposed outside the mixture.

In the power supply module according to another aspect of the present disclosure, another ground connection electrode is assembled on the circuit board next to the coil component. The another ground connection electrode is connected to the ground terminal. The another ground connection electrode is in the rectangular arch shape. One of a top and a side of the another ground connection electrode is exposed outside the mixture.

In the power supply module according to another aspect of the present disclosure, the circuit board is formed by a plurality of board layers. The ground terminal is provided on one of the plurality of board layers that faces another of the plurality of board layers.

An effect of the present disclosure is to provide an electronic component with a coil, a method for manufacturing the electronic component, and a power supply module that have a superior property against static electricity because a part of the ground connection electrode is exposed outside the mixture (package). Another effect of the present disclosure is to provide a method for manufacturing an electronic component in which electromagnetic interference does not occur by using a fairly easy and simple manufacturing process with a high yield. The electromagnetic interference against other components assembled on a printed circuit board on which a coil is assembled is reduced by a metal composite magnetic material in a mixture. In addition, because the fairly easy and simple manufacturing process can be used, the manufacturing cost can be significantly reduced. Further, because an electronic component with a coil is manufactured by injecting a mixture into a metal mold with a fairly low pressure compared with the pressure from a conventional press machine, there is a very low possibility of breaking passive components or a coil assembled on a printed circuit board (PCB). Thus, deformation and breakage of a coil and a ground connection electrode can be prevented.

DESCRIPTION OF EXEMPLARY EMBODIMENT

First Embodiment

Figure 1:
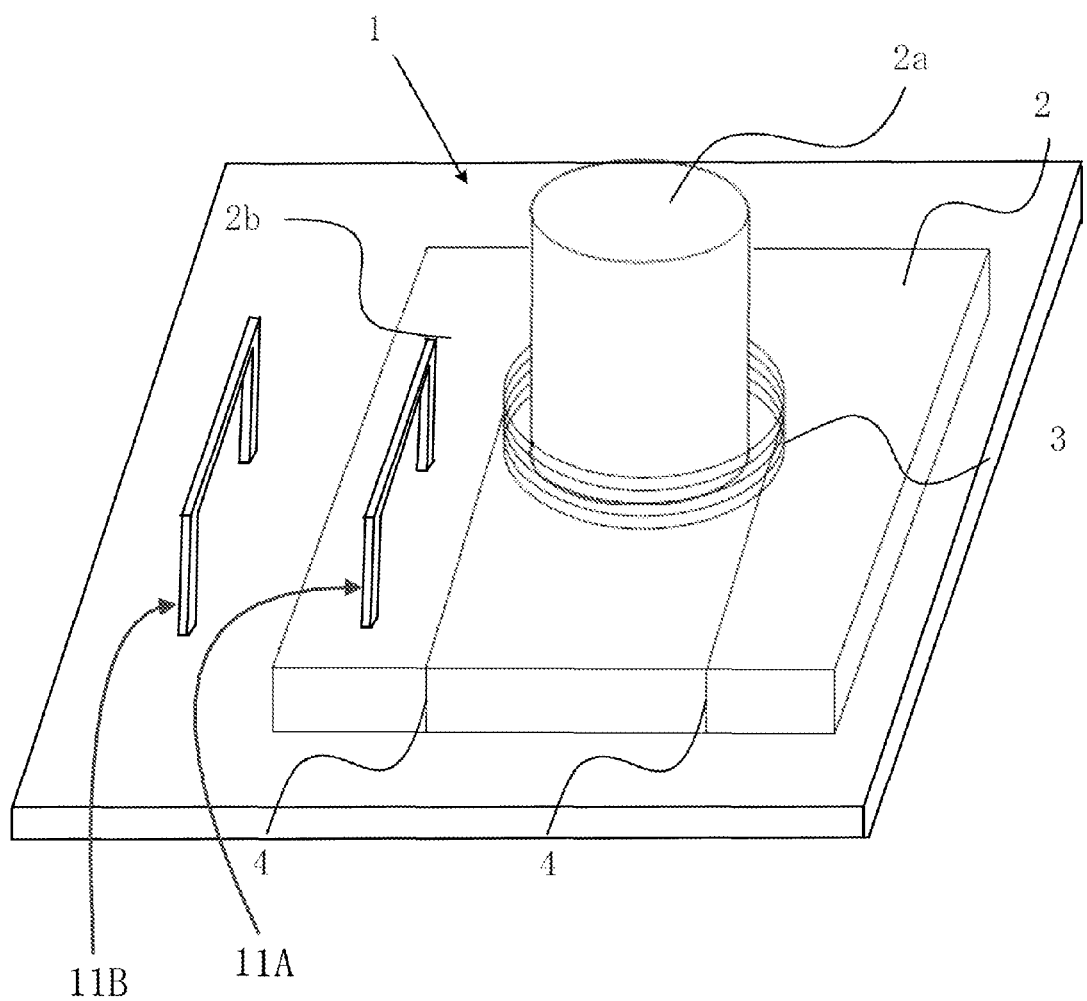
FIG. 1 is a perspective view that shows an inductor element as an intermediate product in a manufacturing process that is configured with a T-shaped core and an air-core coil.
Figure 2A:
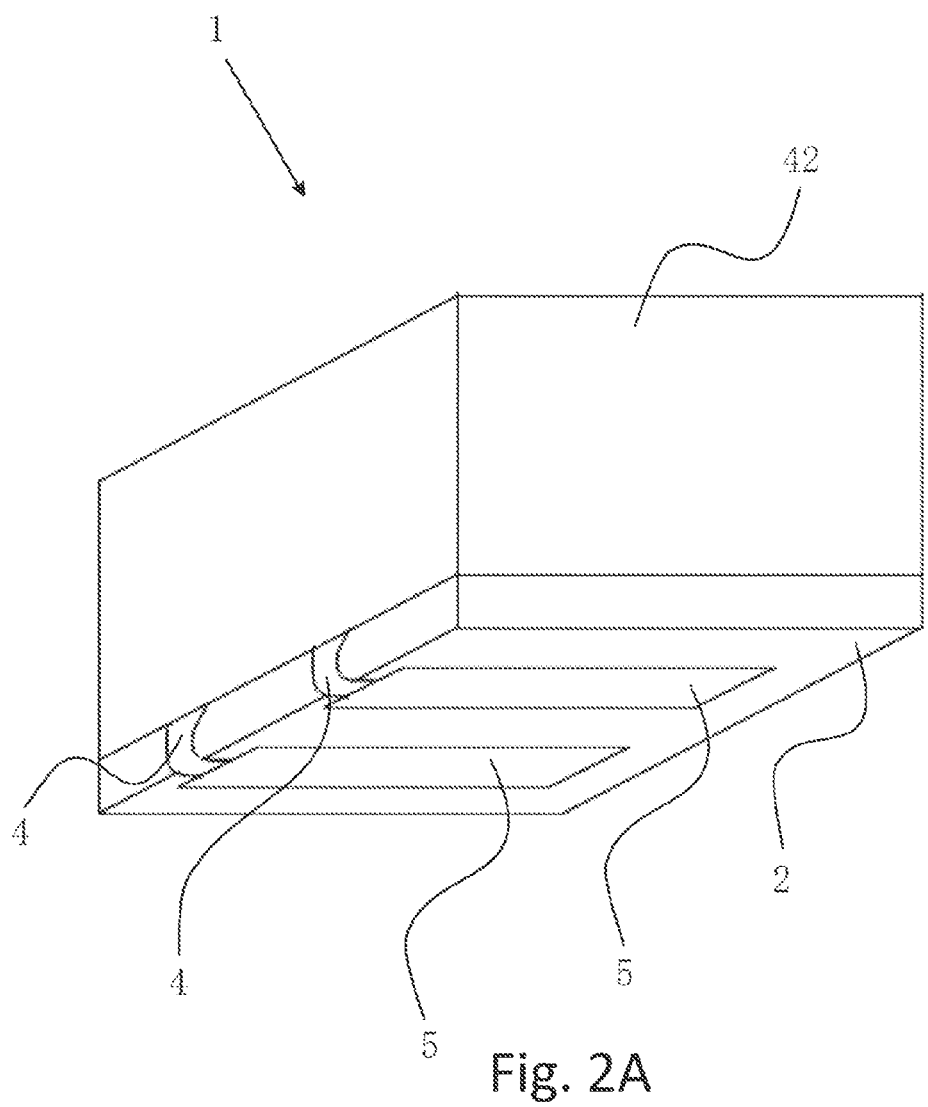
FIGS. 2A and 2B are a perspective view and a top plan view, respectively, that show an inductor element as a final product.
Figure 2B:
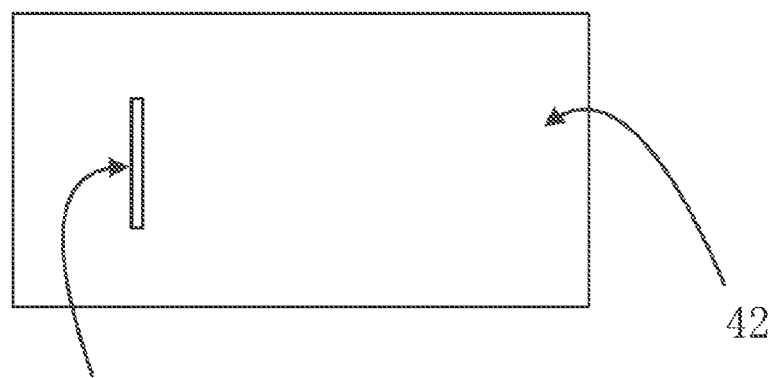

An inductor element and a method for manufacturing the inductor element are explained below with reference to the drawings. FIG. 1 is a perspective view that shows an inductor element 1 as an intermediate product in a manufacturing process that is configured with a T-shaped core 2 and an air-core coil 3. In FIG. 1, the number of illustrated windings is reduced to ease the explanation of the winding condition of conducting wire 4. FIGS. 2A-2B are a perspective view and a top plan view that show the inductor element 1 as a final product. In FIGS. 2A-2B, the T-shaped core 2 and the air-core coil 3 are sealed by a mixture 42 of a metal composite magnetic material and a resin. A bottom surface of the T-shaped core 2 is shown in FIG. 2A. The T-shaped core 2 is configured with a cylindrical post-shaped core part 2a projecting generally perpendicularly from a planar or flat base part 2b as shown in FIG. 1. Because the cross section of the T-shaped core 2 is in a T shape, it is referred to as the T-shaped core 2. The size of the inductor element 1 is preferably about 6 mm (width)×9 mm (length)×2.2 mm (height). It is preferred to use a T-shaped core for an inductor element.

In FIG. 1, there are two ground connection electrodes 11A, 11B. Note that it may be desirable to omit one of the two ground connection electrodes 11A, 11B in a given product. In that case, one of the ground connection electrodes 11A, 11B would suffice. If the inductor element is assembled on a printed circuit board ("circuit board" or "PCB") 64, the ground connection electrode 11A may not be required. The ground connection electrodes 11A, 11B are made of a conductive metal, such as copper (Cu). It is preferred that if copper is used for the ground connection electrodes 11A, 11B, a gold plating or a nickel plating is made on the surface of the copper. When the gold plating or nickel plating is provided, it is easy to perform a soldering process to the circuit board 64 and such plating can prevent the surface of the copper from rusting and corroding. A size of the ground connection electrodes 11A, 11B is preferably as follow: a width is 0.5 mm and a height is 0.3 mm. Thus, the ground connection electrodes 11A, 11B have a rectangular-shaped cross section.

As shown in FIG. 1, the ground connection electrodes 11A, 11B are in a rectangular arch shape ("n" shape). A length of a top longitudinal part of the ground connection electrodes 11A, 11B is preferably about 5 to 7 mm. After the ends of the ground connection electrodes 11A, 11B are soldered to the circuit board 64, the ends are connected to a ground terminal (not shown) provided inside the circuit board 64. The circuit board 64 is preferably configured with a plurality of board layers. The ground terminal is formed on one of the plurality of board layers. The board layer on which the ground terminal is formed faces another of the plurality of board layers. Thus, the ground terminal is not exposed outside the circuit board 64. However, the ground terminal is connected to a ground potential through the circuit board 64.

As shown in FIG. 2A, the inductor element 1 is covered and surrounded by the mixture 42 of a metal composite magnetic material and a resin that will be explained in detail below. When the inductor element 1 is assembled on the circuit board 64, the bottom part in FIG. 2A is the circuit board 64. However, the inductor element 1 is not assembled on the circuit board 64, the bottom part in FIG. 2A is the planar or flat base part 2b of the T-shaped core 2. In FIG. 2B, the top (longitudinal) part of the ground connection electrode 11A (11B) is exposed outside the mixture 42.

Because the top part of the ground connection electrode 11A (11B) is exposed outside the mixture and because the other ends of the ground connection electrode 11A (11B) are connected to the ground potential through the ground terminal provided in the circuit board 64, static electricity does not tend to be generated at the surfaces of the inductor element 1. Even if static electricity is generated at the surfaces of the inductor element 1 during manufacturing, assembling, handling or transportation of the inductor element 1, static electricity can be eliminated by the exposed ground connection electrode 11A (11B). Therefore, an insulation resistance between the air-core coil 3 and the surface of the mixture does not decrease to several kΩ. The insulation resistance can be maintained at about 100 MΩ or more in an ideal condition.

As explained later with reference to FIGS. 6A-6C, 7A-7C, 8A-8C, 9 and 10, the shape of the ground connection electrode 11A(11B) is not limited to the above explained structure. A side of the ground connection electrode 11A(11B) may be exposed outside the mixture rather than the top part. It is also preferred that both the top part and side can be exposed outside the mixture. One or more bar-shaped ground connection electrodes can also be used. In this case, a tip of the bar-shaped ground connection electrode is exposed outside the mixture. The number of ground connection electrodes is not limited to one, and instead two or more ground connection electrodes can be used. It is preferred that two rectangular arch shaped ground connection electrodes are provided at the circuit board. It is also preferred that a ground connection electrode is provided next to a coil.

Second Embodiment

Figure 3:
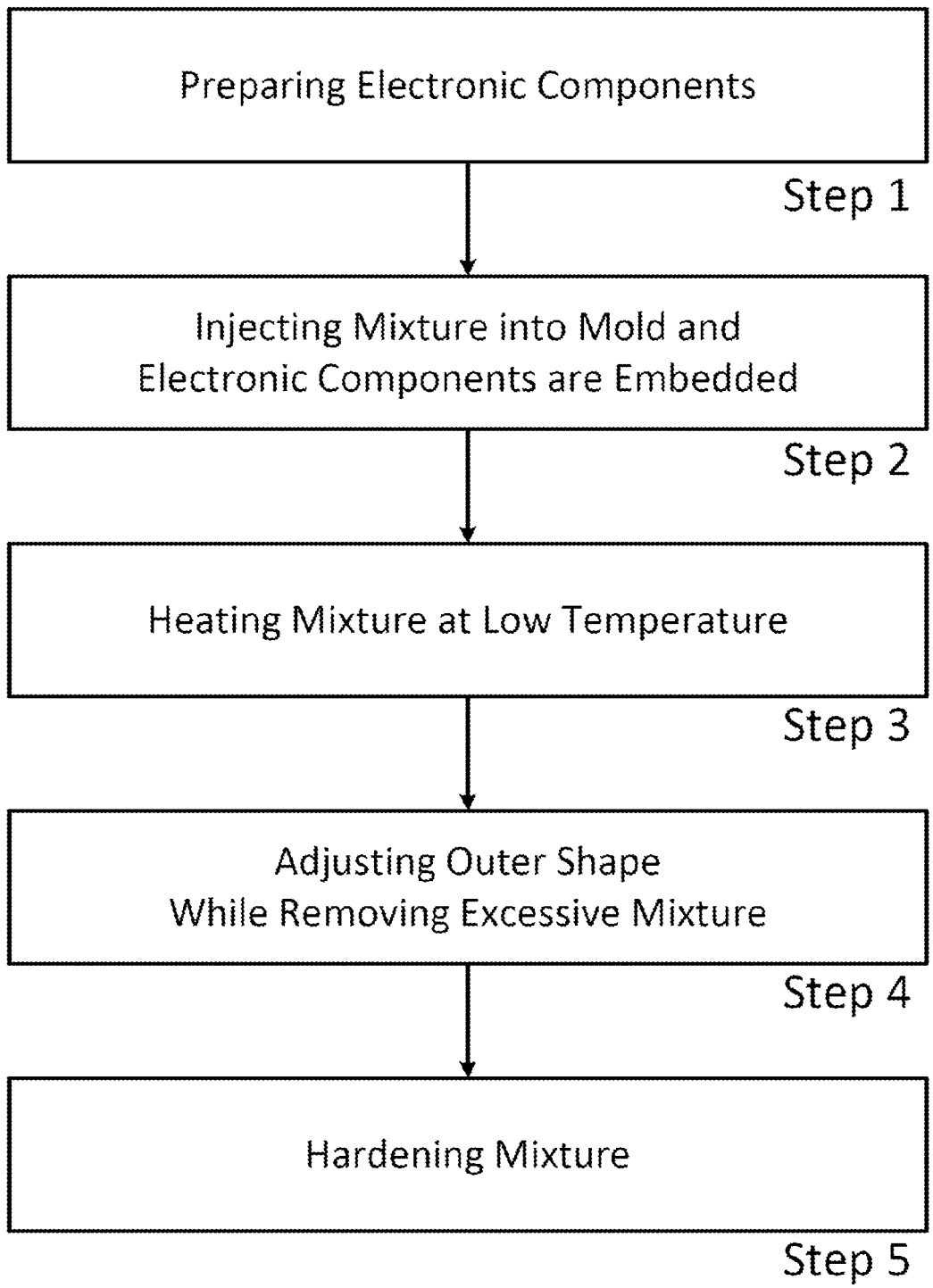
FIG. 3 is a manufacturing flow diagram that shows a manufacturing process for making an electronic component.

FIG. 3 is a flow diagram that shows a manufacturing process for making an electronic component, such as the inductor element 1 or a power supply module. As shown in FIG. 3, the manufacturing process is configured with several consecutive steps. The steps include: Step 1-preparing the T-shaped core 2, the air-core coil 3 (electronic components) and the ground connection electrode 11A(11B); Step 2-Injecting the mixture into a mold to embed the T-shaped core 2, the air-core coil 3 (electronic components) and the ground connection electrode 11A(11B); Step 3-heating the mixture at a low temperature; Step 4-adjusting an outer shape while removing excessive mixture; and Step 5-hardening the mixture. Thereafter, if desired, a sixth step may be performed: Step 6-polishing an outside of the hardened mixture 42. A detailed manufacturing method for the inductor element 1 will be explained below.

Preparing T-Shaped Core and Coil Member

First, as shown in Step 1 in FIG. 3, the T-shaped core 2, the air-core coil 3 and the ground connection electrode 11A(11B) are manufactured separately. An inside diameter of the air-core coil 3 is slightly larger than an outside diameter of the core part 2a of the T-shaped core 2.

It is preferred that a material for the T-shaped core 2 has both magnetic and insulation properties. The T-shaped core 2 is preferably made by mixing a magnetic material and an insulation material and by compressing the mixed material with high pressure. Alternatively, the T-shaped core 2 may be made by injecting the mixed material into a metal mold at a high speed after the mixed material is in a molten state by heat. Further alternatively, the T-shaped core 2 may be made by sintering a ferrite material. The compressing method will be explained. The magnetic material is preferably a metal magnetic powder that has Fe as a main composition and other components, such as Cr, Si and Mn. The insulation material is preferably an epoxy resin, glass system material, or ceramics. A solvent and/or a mold release agent may also be used. The solvent is preferably one of acetone, toluene, benzene, alcohol or the like. The solvent is evaporated before a mold process is performed. It is preferred that the T-shaped core 3 is made of FeSi system materials.

Next, the metal magnetic powder and the epoxy resin are mixed to form a mixture with a predetermined viscosity. After the mixture is put into a metal mold, a pressure of 2-5 ton/cm$^2$ is applied by upper and lower punches of a press machine. As a result, the T-shaped core 2 is molded. Thereafter, the epoxy resin is heated to harden so that the T-shaped core 2 is completely formed.

The conducting wire 4 is made by a conducting material, such as copper, with an insulating layer thereover. A cross section of the conducting wire 4 can be, for example, a round shape or a flat rectangular shape. The air-core coil 3 is formed by winding the conducting wire 4 with 0.5 to several turns. As discussed above, an inside diameter of the air-core coil 3 is larger than an outside diameter of the core part 2a of the T-shaped core 2. Specifically, a difference of the diameters is larger than a distance of several times a maximum particle in the mixture. Such a difference of the diameters is desired for fitting the air-core coil 3 over the core part 2a of the T-shaped core 2. In addition, the difference of the diameters is desired for filling the mixture between the core part 2a and the air-core coil 3. If the mixture is not filled between the core part 2a and the air-core coil 3, cavities may remain in that portion. The cavities may cause a crack in the mixtures sealed in the inductor element 1 and may exhibit a poor magnetic property.

The insulating layers at both ends of the conducting wire 4 are removed. When the end wires are dipped in solder for a short period of time, the insulating layer at the ends of the wires are melted and removed by the heat of the solder. At the same time, the solder adheres to the ends of the wires.

Next, the air-core coil 3 is assembled with the T-shaped core 2 as shown in FIG. 1. After solder is applied at both ends of the end wires of the conducting wire 4, the air-core coil 3 is placed on an upper surface of the flat base part 2b of the T-shaped core 2 as shown in FIG. 1. The end wires are bent at a side of the T-shaped core 2 to extend to a bottom surface of the flat base part 2b of the T-shaped core 2. After both ends of the conducting wire 4 are flattened, flattened ends 5 are fixed on the bottom surface of the T-shaped core 2 as shown in FIG. 2. Note that for the ease of understanding, a width of the illustrated conducting wire 4 is widened further in FIG. 2 than in FIG. 1. The ground connection electrode 11A(11B) is directly formed at the flat base part 2b of the T-shaped core 2 or at the circuit board 64. When the ground connection electrode 11A(11B) is assembled on the circuit board 64, the inductor element 1 is also assembled on the circuit board 64.

Preparing Mixture

It is preferred that a mixture is prepared at nearly the same time as preparing the T-shaped core 2 and the air-core coil 3. It is preferred that the mixture is made of magnetic and insulation materials as the T-shaped core 2. Specifically, the magnetic material is preferably silicon steel. Silicon steel generally contains 3-4% of silicon and 96-97% of steel. Another metal, such as Cr, can be added. FeSiCr system is preferred as the metal magnetic material. More preferably, the metal magnetic material is Fe4Si4Cr. The insulation material is preferably a thermoplastic resin, such as a silicone resin. Any resin that has a heat resistance property that is tolerant of the heat at the time of assembling and packaging the electronic component may be used. It is preferred that the insulation material is an epoxy resin. The mixture is formed by mixing the metal magnetic material and the insulation material. Therefore, the mixture may be referred to as metal paste. A mixing ratio of the FeSiCr system and the epoxy resin is between 95 wt %:5 wt % and 97 wt %:3 wt %. It is preferred that the ratio of the FeSiCr system and the epoxy resin is 95 wt %:5 wt %. If an amount of the FeSiCr system exceeds 97 wt %, the final material strength is poor. The viscosity of the mixture is about 1000 mPa·s at room temperature, i.e., this is similar to soldering paste or honey (which should be easy for one skilled in the art to understand). A solvent can be used to adjust viscosity.

Injecting Mixture into Mold

Figure 4:
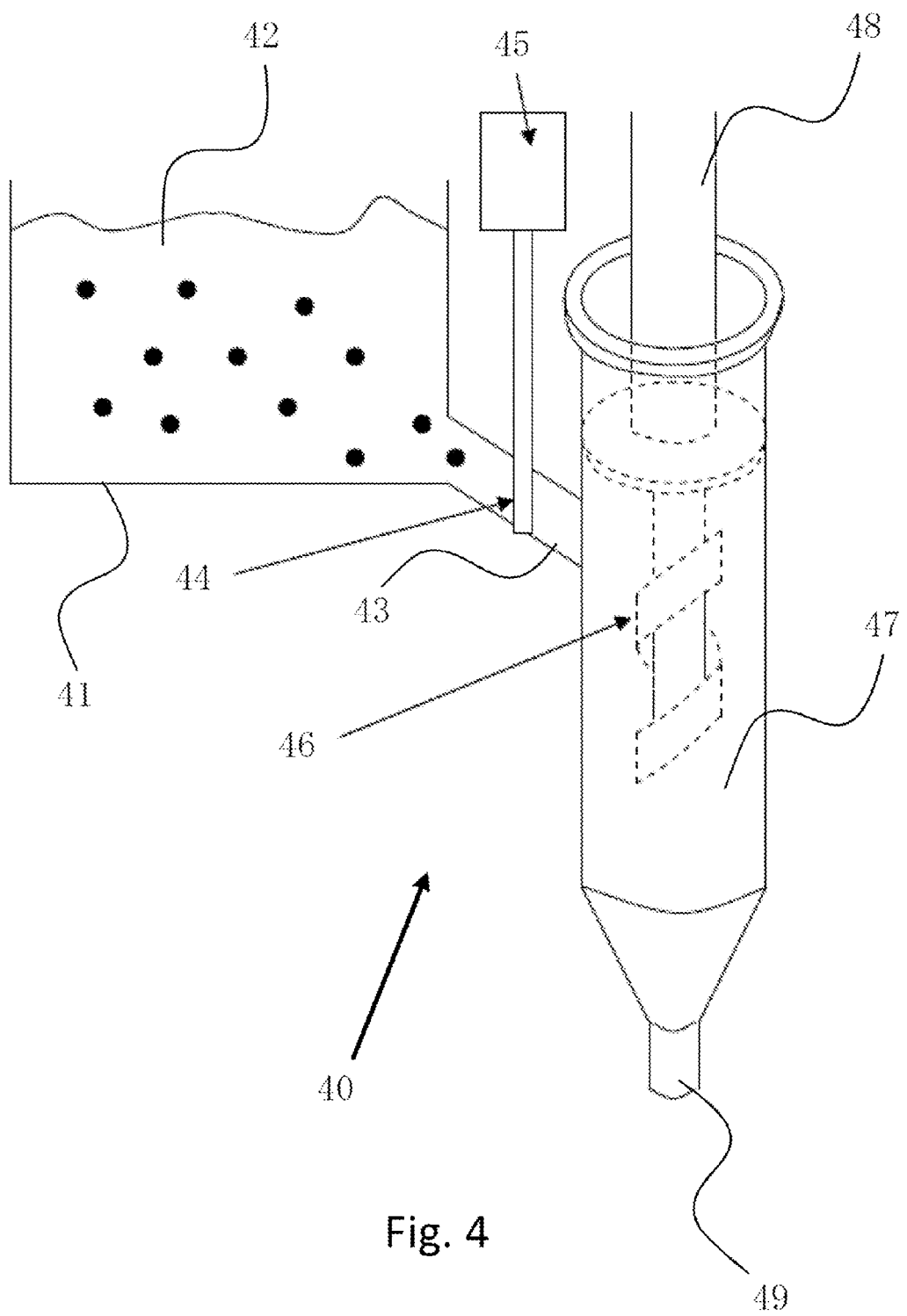
FIG. 4 is a schematic view that shows a dispenser that supplies a mixture into a metal mold to embed an electronic component.
Figure 5:
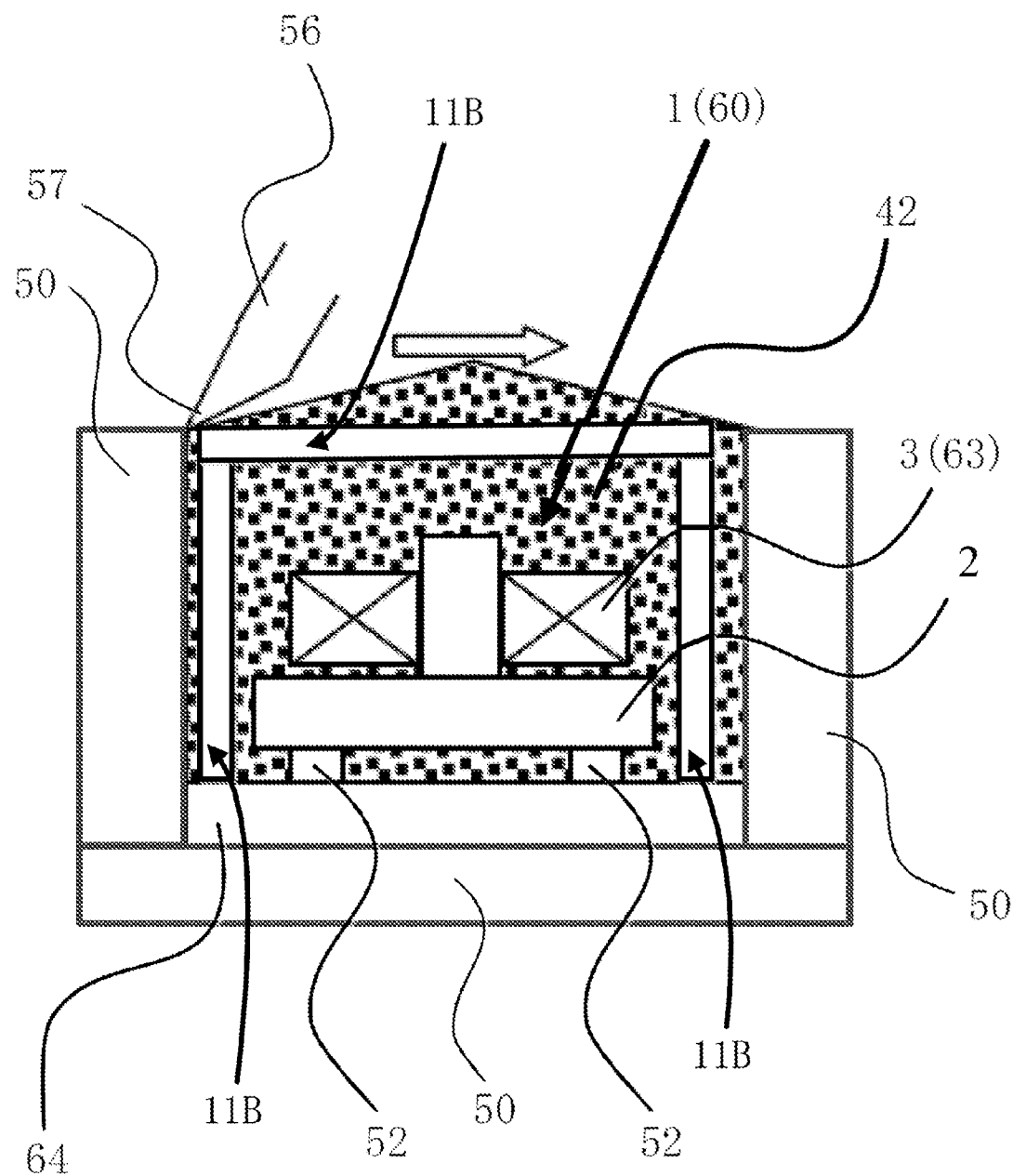
FIG. 5 is a schematic view that shows a process for removing excessive mixture by a sharp edge of a remover.

FIG. 4 is a schematic view that shows a dispenser 40 that supplies a mixture 42 into a metal mold 50 to embed an inductor element 1. FIG. 5 is a schematic view that shows a process for removing excessive mixture by a sharp edge 57 of a remover 56.

The dispenser 40 is configured with a material tank 41, a mixture 42, a flow passage 43, a valve 44, a valve driving unit 45, a mixer 46, a cylinder 47, a piston 48 and a discharge opening 49. The mixture 42 that is stored in the material tank 41 flows through the flow passage 43. The valve driving unit 45 controls opening and closing of the valve 44. When the valve 44 is open, the mixture 42 flows toward the cylinder 47. When the valve 44 is closed, the mixture cannot flow toward the cylinder 47. The cylinder 47 has the mixer 46 and the piston 48 that pushes the mixture 42 in the cylinder 47 toward the discharge opening 49. The mixer 46 further mixes the mixture 42 in the cylinder 47. The valve driving unit 45 and the piston 48 are controlled by a control unit (not shown) to adjust the amount of mixture 42 discharged into a mold. It is preferred that an area of the discharge opening 40 is wider than an opening of a mold to improve productivity.

In FIG. 5, a circuit board (PCB) 64, electrodes 52, an air-core coil 3 (63), a T-shaped core 2 and a ground connection electrode 11 are placed in a mold 50. Note that if only an inductor element 1 (60), which is configured with the air-core coil 3 (63) and the T-shaped core 2, is placed in the mold 50, the PCB 64, the electrodes 52, the ground connection electrode 11 are not required to be assembled to the inductor element 1 (60).

As shown in Step 2 in FIG. 3, after the above components are placed in the mold 50, the mixture 42 is injected into the mold 50 from the discharge opening 49 of the dispenser 40 and embeds the above components as shown in FIG. 5. In other words, the entire space in the mold 50 is filled with the mixture 42. At this time, the mixture 42 to be injected preferably has a temperature in a range of 20 to 50° C. and more preferably 25° C. Because the volume of the mixture 42 decreases by later processes, the mixture 42 is injected over the opening of the mold 50.

In the above description, the mixture 42 is stored in the material tank 41. However, the present invention is not limited to the above disclosure. The material tank 41 preferably stores only the metal magnetic material. The epoxy resin may be added in the cylinder 47 and mixed with the metal magnetic material by the mixer 46.

Heating Mixture at Low Temperature

As shown in Step 3 in FIG. 3, while the above components are placed in the mold 50 as shown in FIG. 5, a low temperature heating process is performed by a heater. The mold 50 having the above components is transferred from the dispenser 40 to a heater (not shown). It is preferred that the low temperature for this heating process is in a range of 60 to 100° C. and more preferably 80° C. It is preferred that the process time is in a range of 5 to 120 minutes, and more preferably 60 minutes. The solvent in the mixture is evaporated by the low temperature heating process. The viscosity of the mixture 42 is slightly increased by the low temperature heating process. However, the mixture 42 is not fully hardened.

Since the solvent in the mixture 42 is evaporated, small cavities/spaces may be created in the mixture 42. The small cavities/spaces may cause undesirable influences with respect to the compactness and outer appearance of the inductor element 1. If a big cavity is created in the mixture 42, the magnetic flux around the big cavity is disordered. Further, magnetic saturation tends to occur. These problems can be solved by a subsequent process that is explained later.

A conveyer furnace or an infrared heater can be used for performing the above low temperature heating process. A small heater can be added to the dispenser 40. In this case, it is preferred to add the small heater close to the discharge opening 49. The small heater can evaporate the solvent while a smooth flow of the mixture 42 is maintained prior to the small heater. Because the small heater can evaporate a part of the solvent, the processing time for the low temperature heating process can be shortened. At the same time, productivity can be improved.

Adjusting Outer Shape while Removing Excessive Mixture

As shown in Step 4 in FIG. 3, an outer shape of the mixture 42 is adjusted. In addition, excessive mixture 42 is removed. The mold 50 having the above components is transferred from the heater and processed by the remover 56. The remover 56 may be referred to as a scraper. As shown in FIG. 5, the sharp edge 57 of the remover 56 is slid from the left hand side to the right hand side along a solid line while the above components are still inside the mold 50. The sharp edge 57 of the remover 56 is slid along the top surface of the mixture with a preferable angle of 0 to 20 degrees with respect to a top surface of the mold 50. More preferably, the angle is 15 degrees. In this removing process, a pressure of 0.1 to 20.0 kg/cm² may be applied to the mixture to reduce or eliminate the cavities/spaces that are formed by the low temperature heating process as discussed above. It is more preferred that the pressure is in a range of 1 to 10 kg/cm².

Note that when the sharp edge 57 of the remover 56 is slid from the left hand side to the right hand side along a solid line while the above components are still inside the mold 50, a direction of the longitudinal top of the ground connection electrode 11 is in the same direction of the movement of the remover 56. If the direction of the longitudinal top of the ground connection electrode 11 is opposite (e.g., perpendicular) to the movement direction of the remover 56, the ground connection electrode 11 may be deformed by the removing pressure as discussed above. The longitudinal top of the ground connection electrode 11 is aligned approximately with a top of the mold so that the longitudinal top of the ground connection electrode 11 can be exposed outside the mixture 42.

However, the present invention is not limited to the above disclosure. The removing process above can be performed separately from the pressure applying process. Before or after the removing process for removing excessive mixture 42, a pressure of 0.1 to 20.0 kg/cm² is applied to the mixture 42 for adjusting an outer shape of the mixture 42 by a movable punch of a press machine.

Hardening Mixture

As shown in Step 5 in FIG. 3, the mixture 42 is hardened by another heater. The mold 50 having the above components is transferred from the heater for the low temperature heating process to another heater for a high temperature heating process. Alternatively, a two stage heater can be used. The purpose of the high temperature heating process is for hardening the mixture 42 so that it is in a stable state as a final product. It is preferred that the high temperature for this heating process is in a range of 120 to 200° C. and more preferably 150° C. It is preferred that the process time is in a range of 10 to 90 minutes, and more preferably 30 minutes. In the high temperature heating process, a state of the mixture 42 is changed from a half-dried solid state to a solid state. A conveyer furnace or an infrared heater can be used for performing the above high temperature heating process.

Polishing Outside Hardened Mixture

After the hardened mixture 42, i.e., a hardened inductor element 1, is removed from the mold 50, the hardened inductor element 1 can be placed in, for example, a centrifugal barrel polishing machine (not shown) to perform a polishing process. Flashes or burrs that are formed on an outside of the hardened mixture 42 (inductor element 1) are removed by the centrifugal barrel polishing machine. In the polishing process, lead terminals formed on the outside of the inductor element 1 are also polished by the centrifugal barrel polishing machine to improve electrical connectivity. In this case, after polishing the outside of the hardened mixture 42, it is important that a part of the ground connection electrode 11 is exposed outside the mixtures without breaking of the connection to a ground potential.

As discussed above, the manufacturing steps for manufacturing an inductor element are reduced so that production costs can be decreased. In a conventional inductor element that is manufactured by a high pressure method by using punches of a press machine, the upper and lower punches of the press machine press the mixture in the metal mold with a pressure of 3-5 ton/cm². An inductor element manufactured by such high pressure has the following properties: (used power supply is 1V-20 A); DCR (direct current resistance) is 2.7 mΩ; and CL (W) (copper loss or ohmic loss) is 1.08 W. On the other hand, the inductor element 1 according to the present embodiment has the following properties: (used power supply is 1V-20 A); DCR is 1.8 mΩ; and CL (W) is 0.72 W. Therefore, the inductor element 1 according to the present embodiment has superior properties. The DCR of the inductor element 1 is 33% smaller than the conventional inductor element. The CL (W) is significantly reduced.

Third Embodiment

Figure 6A:
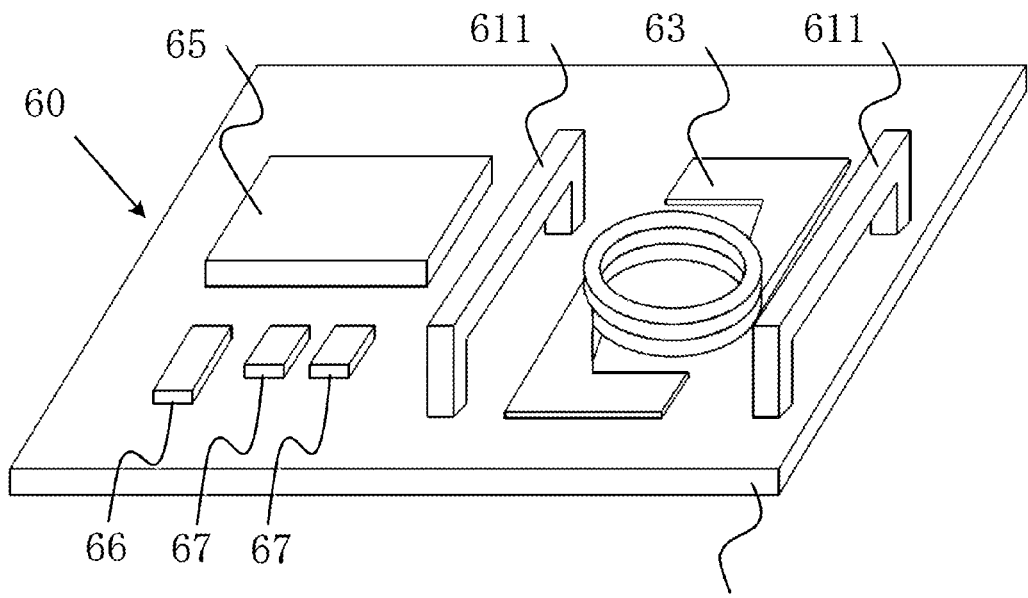
FIGS. 6A-6C are respectively: a perspective view that shows a power supply module as an intermediate product in a manufacturing process; a side view that shows a power supply module as an intermediate product in a manufacturing process; and a perspective side view of the power supply module after a manufacturing process is complete. The power supply module is configured with an inductor (an air-core coil), a ground connection electrode, a printed circuit board (PCB), an integrated circuit (IC), a resistor, and a capacitor.
Figure 6B:
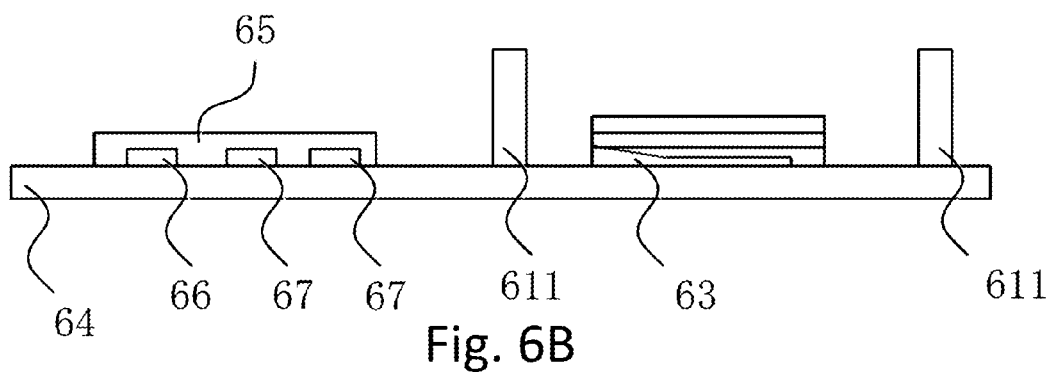
Figure 6C:
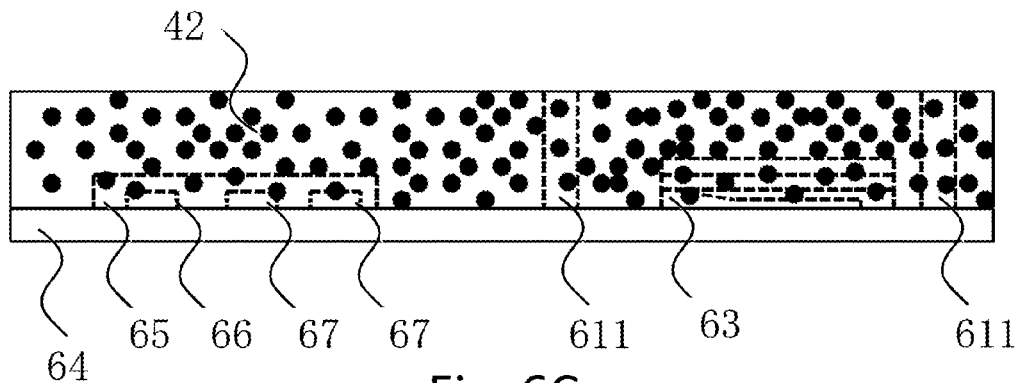

A power supply module 60 and a method for manufacturing the power supply module 60 are explained below with reference to the drawings. FIGS. 6A-6b are respectively a perspective view and a side view that show the power supply module 60 as an intermediate product in a manufacturing process. FIG. 6C is a perspective side view of the power supply module 60 after a manufacturing process is complete. The power supply module 60 is configured with the inductor (an air-core coil) 63, two ground connection electrodes 611, the printed circuit board (PCB) 64, the integrated circuit (IC) 65, and the passive components 66, 67 (resistor 66 and capacitors 67). The same elements shown in FIGS. 6A-6C and other drawings have the same reference numerals. The inductor element 63 can be made by the same processes as for the inductor element 1 that are shown in FIGS. 1 and 2 as explained above. Thus, detailed explanations of manufacturing the inductor element 63 are omitted here. After the inductor element 63 is made, the inductor element 63 is assembled on the PCB 64. At this time, the flattened ends 5 (shown in FIG. 2) are connected to conducting areas (not shown), such as terminals or electrodes, provided on the PCB 64. The IC 65, the resistor 66, and the capacitors 67 are assembled on the PCB 64 to form the power supply module 60. Two ground connection electrodes 611 in a rectangular arch shape are also assembled on the PCB 64. As explained above, the ends of the ground connection electrodes 611 are connected to the ground terminal provided inside the PCB 64. The ground terminal is connected to a ground potential. A material and a size of the ground connection electrodes 611 are the same as the ground connection electrode 11A(11B). Top longitudinal parts of the ground connection electrodes 611 are exposed outside the mixture 42 as shown in FIG. 6C after the components are covered by the mixture 42. The size of the power supply module 60 is preferably about 9 mm (width)×11 mm (length)×2.2 (2.2 to 2.8) mm (height). It is preferred that a T-shaped core (as explained in the previous and next embodiments) and an I-shaped core are used for a power supply module. An I-shaped core is a cylindrical post-shaped core or a bar-shaped core. If a planar or flat base part of a T-shaped core is removed, a remaining cylindrical post-shaped part can be an I-shaped core. The cross section of an I-shaped core is generally a circle or a rectangle.

In FIGS. 6A-6C, two ground connection electrodes 611 are assembled on the PCB 64 in a direction parallel to a shorter side of the PCB 64 and by sandwiching the inductor element 63. One of the ground connection electrodes 611 can be omitted if the power supply module 60 has enough static electricity resistance.

A manufacturing process for the power supply module 60 is the same as the inductor element 1 explained in FIG. 3. As shown in FIG. 3, the manufacturing process is preferably configured with five steps. The five steps are as follow: Step 1-preparing the inductor element 63, the ground connection electrode 611 assembled on the PCB 64, the PCB 64, the IC 65, the resistor 66, and the capacitors 67 (electronic components); Step 2-Injecting the mixture into a mold to embed the inductor element 63, the ground connection electrode 611, the PCB 64, the IC 65, the resistor 66, and the capacitors 67 (electronic components); Step 3-heating the mixture at a low temperature; Step 4-adjusting an outer shape while removing excessive mixture; and Step 5-hardening the mixture. Further, if desired, a sixth step may be performed: Step 6-polishing an outside of the hardened mixture 42. A detailed manufacturing method for the power supply module 60 will be explained below.

Preparing Power Supply Module

First, as shown in FIGS. 6A and 6B and as shown in Step 1 in FIG. 3, the ground connection electrode 611, the IC 65 and passive components, such as the resistor 66 and capacitors 67, are assembled on the PCB 64 so as to electrically connect to each other. If the power supply module 60 (with the PCB 64) is assembled to another bigger assembly board (not shown), metal terminals and metal pads are formed on the upper and/or bottom surfaces of the PCB 64.

It is preferred to form an insulating film (not shown), such as an insulating resin, on the PCB 64, the ground connection electrode 611, the IC 65, and passive components, such as the resistor 66 and the capacitors 67. The insulating resin is used for the purpose of insulation between the above components and other parts. The insulating resin is also used for absorbing an injecting force of a mixture 42 of a metal magnetic material and a resin in the subsequent process after the power supply module 60 is placed in a mold 50. Therefore, the power supply module 60 is not broken by an injecting process of the mixture 42. Further, the insulating resin is used for fixing the inductor element 63 to (terminals or pads of) the PCB 64. When the insulating resin is formed on the PCB 64 and the above described components, the insulating resin is not formed on predetermined areas. Terminals or pads of the PCB 64 are located in predetermined areas to electrically connect to the flattened ends 5, which are formed on the bottom surface of the inductor element 63 (1) (see FIG. 2).

As discussed above, the inductor element 63 is manufactured in the same manner as explained above. Thus, the manufacturing explanations are omitted here. After the inductor element 63 is formed, the inductor element 63 is assembled on the PCB 64 so as to electrically connect to each other. At this time, as discussed above, the end wires of inductor element 63 are bent at a side of the inductor element 63 to extend to the bottom surface of the inductor element 63. After both ends of the conducting wire 4 are flattened, the flattened ends 5 are fixed on the bottom surface of the inductor element 63 as shown in FIG. 2. However, the present invention is not limited to the above configuration. The end wires of the inductor element 63 are bent at a side of the PCB 64 to extend to a bottom surface of the PCB 64. After both ends of the conducting wire 4 are flattened, the flattened ends (similar to the flattened ends 5 shown in FIG. 2) are fixed to terminals or pads located on the bottom surface of the PCB 64.

Preparing Mixture

It is preferred that a mixture is prepared at nearly the same time as preparing the PCB 64, assembling the ground connection electrode 611, the IC 65, the resistor 66, the capacitors 67, and the inductor element 63 to the PCB 64. It is preferred that the mixture is made of both metal magnetic and insulation materials as the T-shaped core 2. Specifically, the metal magnetic material is silicon steel. Silicon steel generally contains 3-4% of silicon and 96-97% of steel. Another metal, such as Cr, can be added. FeSiCr system is preferred as the metal magnetic material. More preferably, the metal magnetic material is Fe4Si4Cr. The insulation material is preferably a thermoplastic resin, such as a silicone resin. Any resin that has a heat resistance property that tolerates the heat at the time of assembling and packaging an electronic component can be used. It is preferred that the insulation material is an epoxy resin. The mixture is formed by mixing the metal magnetic material and the insulation material. Therefore, the mixture may be referred to as metal paste. A mixing ratio of the FeSiCr system and the epoxy resin is preferably between 95 wt %:5 wt % and 97 wt %:3 wt %. It is preferred that the ratio of the FeSiCr system and the epoxy resin is 95 wt %:5 wt %. If an amount of the FeSiCr system exceeds 97 wt %, the final material strength may be poor. The viscosity of the mixture is about 1000 mPa·s at room temperature. A solvent can be used to adjust viscosity.

Injecting Mixture into Mold

FIG. 4 is a schematic view that shows a dispenser 40 that supplies the mixture 42 into the metal mold 50 to embed the power supply module 60. FIG. 5 is a schematic view that shows a process for removing excessive mixture by the sharp edge 57 of the remover 56. The injecting mixture process for the power supply module 60 is the same as that of the inductor element 1 as discussed above and therefore a detailed explanation will be omitted here.

The dispenser 40 supplies the mixture to the metal mold 50 shown in FIG. 5 to embed the power supply module 60. The configurations and functions of the dispenser 40 are the same as above. Thus, detailed explanations are omitted here.

In FIG. 5, the PCB 64 with the ground connection electrode 611, the IC 65 and the passive components 66, 67, electrodes 52 and the inductor element 63 are placed in the mold 50.

As shown in Step 2 in FIG. 3, after the above components are placed in the mold 50, the mixture is injected into the mold 50 from the discharge opening 49 of the dispenser 40 and embeds the above components as shown in FIG. 5. In other words, the entire space in the mold 50 is filled with the mixture 42. At this time, the mixture 42 to be injected has the following properties. A temperature of the mixture is in a range of 20 to 50° C., and more preferably 25° C. Because the volume of the mixture 42 decreases by later processes, the mixture 42 is injected over the opening of the mold (70).

In the above description, the mixture 42 is stored in the material tank 41. However, the present invention is not limited to the above disclosure. The material tank 41 preferably stores only the metal magnetic material. The epoxy resin may be added in the cylinder 47 and mixed with the metal magnetic material by the mixer 46.

Heating Mixture at Low Temperature

As shown in Step 3 in FIG. 3, while the above components are placed in the mold 50 as shown in FIG. 5, a low temperature heating process is performed by a heater. The mold 50 having the above components is transferred from the dispenser 40 to a heater (not shown). It is preferred that the low temperature for this heating process is in a range of 60 to 100° C., and more preferably 80° C. It is preferred that the process time is in a range of 5 to 120 minutes, and more preferably 60 minutes. The solvent in the mixture is evaporated by the low temperature heating process. The viscosity of the mixture 42 is slightly increased by the low temperature heating process. However, the mixture 42 is not fully hardened.

Since the solvent in the mixture 42 is evaporated, small cavities/spaces may be created in the mixture 42. The small cavities/spaces may cause undesirable influences with respect to the compactness and outer appearance of the inductor element 1. If a big cavity is created in the mixture 42, the magnetic flux around the big cavity is disordered. Further, magnetic saturation tends to occur. These problems can be solved by a subsequent process that is explained below.

A conveyer furnace or an infrared heater can be used for performing the above low temperature heating process. A small heater can be added to the dispenser 40. In this case, it is preferred to add the small heater close to the discharge opening 49. The small heater can evaporate the solvent while a smooth flow of the mixture 42 is maintained prior to the small heater. Because the small heater can evaporate a part of the solvent, the processing time for the low temperature heating process can be shortened. Further, productivity is improved.

Adjusting Outer Shape while Removing Excessive Mixture

As shown in Step 4 in FIG. 3, an outer shape of the mixture 42 is adjusted. In addition, excessive mixture 42 is removed. The mold 50 having the above components is processed by the remover 56. The remover 56 may be referred to as a scraper. As shown in FIG. 5, the sharp edge 57 of the remover 56 is slid from the left hand side to the right hand side along a solid line while the above components are still inside the mold 50. The sharp edge 57 of the remover 56 is slid along the top surface of the mixture with a preferred angle of 0 to 20 degrees with respect to a top surface of the mold 50. More preferably, the angle is 15 degrees. In this removing process, a pressure of 0.1 to 20.0 kg/cm$^2$ may be applied to the mixture to reduce or eliminate the cavities/spaces that are formed by the low temperature heating process as discussed above. It is more preferred that the pressure is in a range of 1 to 10 kg/cm$^2$.

Note that when the sharp edge 57 of the remover 56 is slid from the left hand side to the right hand side along a solid line while the above components are still inside the mold 50, a direction of the longitudinal top of the ground connection electrode 611 is in the same direction of the movement of the remover 56. If the direction of the longitudinal top of the ground connection electrode 611 is opposite (e.g., perpendicular) to the movement direction of the remover 56, the ground connection electrode 611 may be deformed by the removing pressure as discussed above. The longitudinal top of the ground connection electrode 611 is aligned approximately with a top of the mold so that the longitudinal top of the ground connection electrode 11 can be exposed outside the mixture 42. Therefore, in FIGS. 6A-6C, the sharp edge 57 of the remover 56 is slid along a shorter side of the PCB 64 (a near side of a drawing sheet to a far side of the drawing sheet).

However, the present invention is not limited to the above disclosure. The removing process above can be performed separately from the pressure applying process. Before or after the removing process for removing the excessive mixture 42, a pressure of 0.1 to 20.0 kg/cm$^2$ may be applied to the mixture 42 for adjusting an outer shape of the mixture 42 by a movable punch of a press machine.

Hardening Mixture

As shown in Step 5 in FIG. 3, the mixture 42 is hardened by another heater. The mold 50 having the above components is transferred from the heater for the low temperature heating process to another heater for a high temperature heating process. Alternatively, a two stage heater may be used. The purpose of the high temperature heating process is for hardening the mixture 42 to have a stable state as a final product. It is preferred that the high temperature for this heating process is in a range of 120 to 200° C. and more preferably 150° C. It is preferred that the process time is in a range of 10 to 90 minutes, and more preferably 30 minutes. In the high temperature heating process, a state of the mixture 42 is changed from a half-dried solid state to a solid state. A conveyer furnace or an infrared heater can be used for performing the above high temperature heating process.

Polishing Outside Hardened Mixture

After a hardened mixture 42, i.e., a hardened power supply module 60, is removed from the mold 50, the hardened power supply module 60 is placed in, for example, a centrifugal barrel polishing machine (not shown) to perform a polishing process. Flashes or burrs that are formed on the outside of the hardened mixture 42 (power supply module 60) are removed by the centrifugal barrel polishing machine. In the polishing process, lead terminals formed on the outside of the power supply module 60 are also polished by the centrifugal barrel polishing machine to improve electrical connectivity. In this case, after polishing the outside of the hardened mixture 42, it is important that a part of the ground connection electrode 611 is exposed outside the mixture 42 without breaking of the connection to a ground potential.

Fourth Embodiment

Figure 7A:
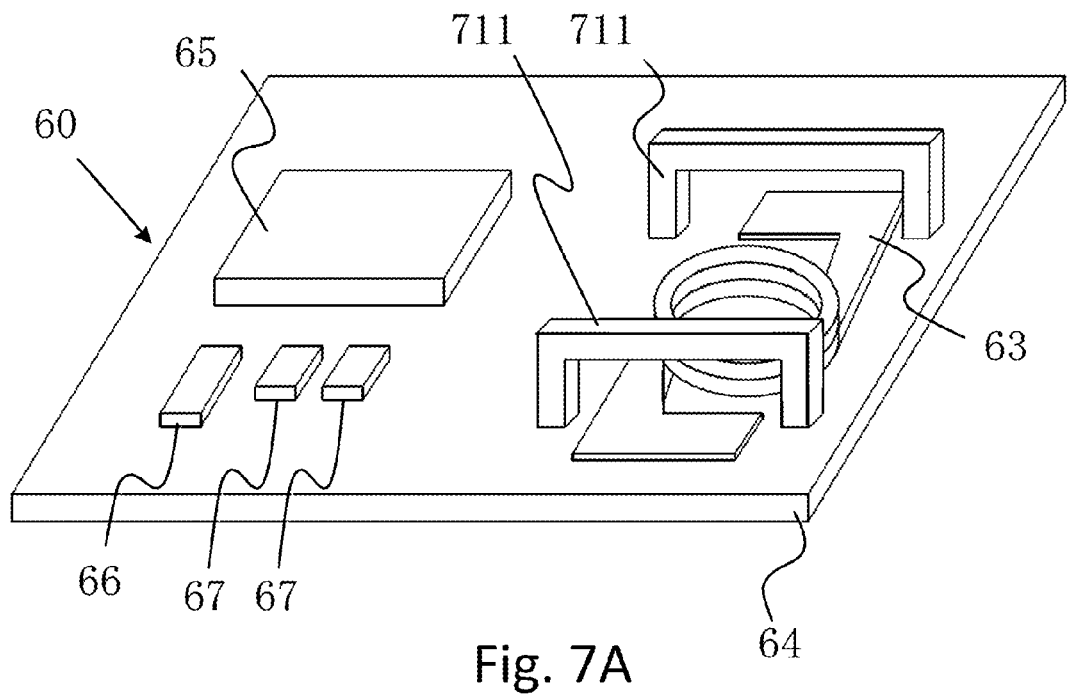
FIGS. 7A-7C are respectively: a perspective view that shows a power supply module as an intermediate product in a manufacturing process; a side view that shows a power supply module as an intermediate product in a manufacturing process; and a perspective side view of the power supply module after a manufacturing process is complete. The power supply module is configured with an inductor (an air-core coil), a ground connection electrode, a printed circuit board (PCB), an integrated circuit (IC), a resistor, and a capacitor.
Figure 7B:
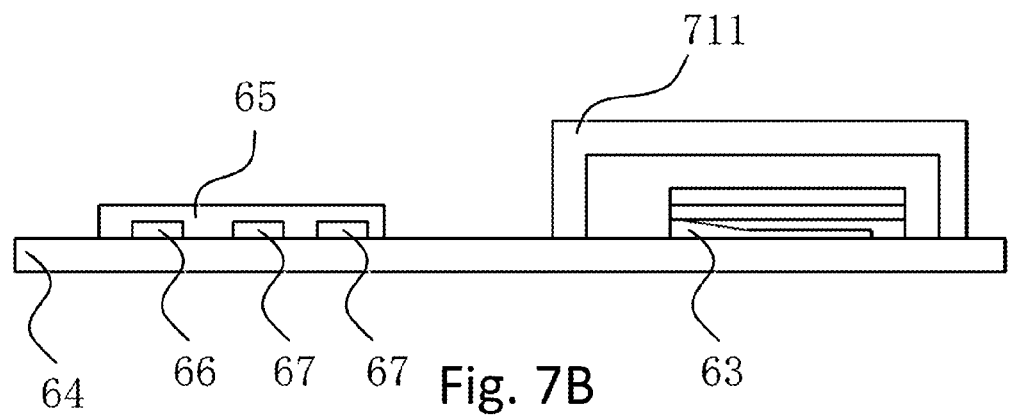
Figure 7C:
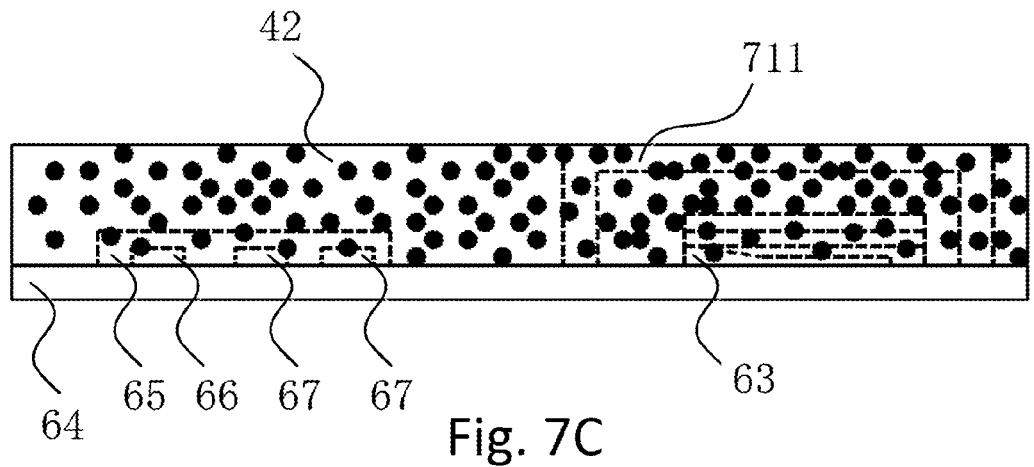

FIGS. 7A-7B are respectively a perspective view and a side view that show the power supply module 60 as an intermediate product in a manufacturing process. FIG. 7C is a perspective side view of the power supply module 60 after a manufacturing process is complete. The power supply module 60 is configured with the inductor (an air-core coil) 63, two ground connection electrodes 711, the printed circuit board (PCB) 64, the integrated circuit (IC) 65, and the passive components 66, 67 (resistor 66 and capacitors 67). The same elements shown in FIGS. 7A-7C and other drawings have the same reference numerals. The inductor element 63 can be made by the same processes as for the inductor element 1 that are shown in FIGS. 1 and 2 as explained above. Thus, detailed explanations of manufacturing the inductor element 63 are omitted here.

A difference between FIGS. 6A-6C and FIGS. 7A-7C is a locational relationship between the ground connection electrodes 711 and other components. In this embodiment, the ground connection electrodes 711 are positioned at 90 degrees from the position of the ground connection electrodes 611 shown in FIGS. 6A-6C. Thus, the ground connection electrodes 711 are parallel to a longer side of the PCB 64. Note that a manufacturing process for making the power supply module 60 shown in FIGS. 7A-7C is the same as the above explanation for the power supply module 60 shown in FIGS. 6A-6C except that a sliding direction of the sharp edge 57 of the remover 56 to remove excessive mixture 42. Therefore, the sharp edge 57 of the remover 56 is slid along the longer side of the PCB 64. The top longitudinal parts of the ground connection electrodes 711 are exposed outside the mixture 42 as shown in FIG. 7C after the components are covered by the mixture 42. The ends of the ground connection electrodes 711, which are assembled and connected to the PCB 64, are connected to the ground terminal (not shown) provided inside the PCB 64 as explained above. The ground terminal is connected to the ground potential. A material and a size of the ground connection electrodes 711 are the same as the ground connection electrode 11A(11B).

In FIGS. 7A-7C, two ground connection electrodes 711 are assembled on the PCB 64 in a direction parallel to the longer side of the PCB 64 and by sandwiching the inductor element 63. One of the ground connection electrodes 711 can be omitted if the power supply module 60 has enough static electricity resistance.

Fifth Embodiment

Figure 8A:
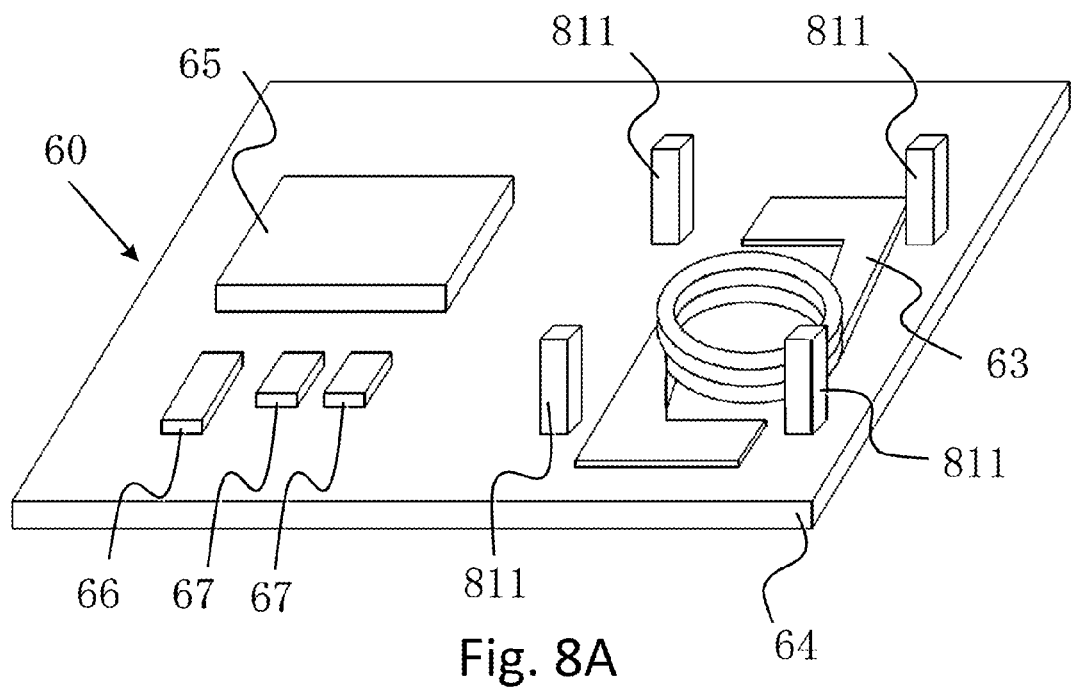
FIGS. 8A-8C are respectively: a perspective view that shows a power supply module as an intermediate product in a manufacturing process; a side view that shows a power supply module as an intermediate product in a manufacturing process; and a perspective side view of the power supply module after a manufacturing process is complete. The power supply module is configured with an inductor (an air-core coil), a ground connection electrode, a printed circuit board (PCB), an integrated circuit (IC), a resistor, and a capacitor.
Figure 8B:
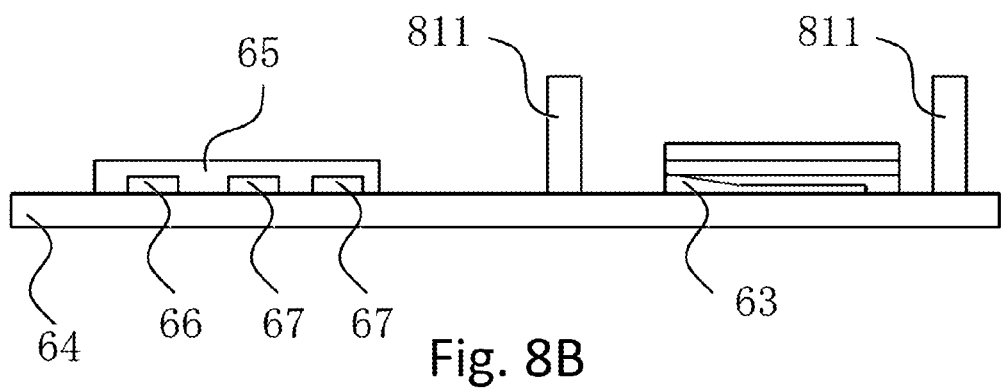
Figure 8C:
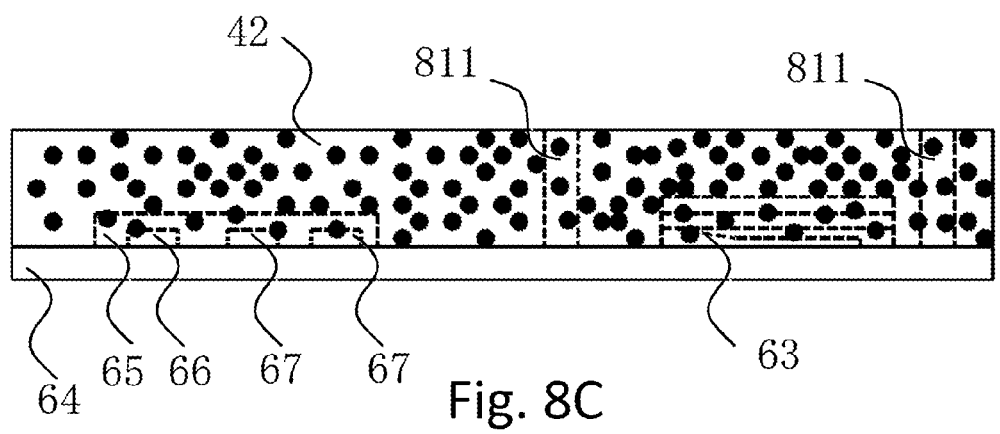

FIGS. 8A-8B are respectively a perspective view and a side view that show the power supply module 60 as an intermediate product in a manufacturing process. FIG. 8C is a perspective side view of the power supply module 60 after a manufacturing process is complete. The power supply module 60 is configured with the inductor (an air-core coil) 63, two ground connection electrodes 811, the printed circuit board (PCB) 64, the integrated circuit (IC) 65, and the passive components 66, 67 (resistor 66 and capacitors 67). The same elements shown in FIGS. 8A-8C and other drawings have the same reference numerals. The inductor element 63 can be made by the same processes as for the inductor element 1 that are shown in FIGS. 1 and 2 as explained above. Thus, detailed explanations of manufacturing the inductor element 63 are omitted here.

A difference between FIGS. 6A-6C and 7A-7C, and FIGS. 8A-8C is a locational relationship between the ground connection electrodes 811 and other components and a shape of the ground connection electrodes 811. In this embodiment, four ground connection electrodes 811 are provided around the inductor element 63. In addition, each of the ground connection electrodes 811 is in a bar shape. Thus, tips of the bar-shaped ground connection electrodes 811 are exposed outside the mixture 42 as shown in FIG. 8C after the components are covered by the mixture 42. The ends of the ground connection electrodes 811, which are assembled and connected to the PCB 64, are connected to the ground terminal (not shown) provided inside the PCB 64 as explained above. The ground terminal is connected to the ground potential. A material of the ground connection electrodes 811 is the same as the ground connection electrode 11A(11B). Note that a manufacturing process for making the power supply module 60 shown in FIGS. 8A-8C is the same as the above explanation for the power supply module 60 shown in FIGS. 6A-6C except that there is no restriction for a sliding direction of the sharp edge 57 of the remover 56 to remove excessive mixture 42. Therefore, the sharp edge 57 of the remover 56 can be slid without any restriction because the ground connection electrodes 811 are in the bar shape and are not deformed by the particular sliding direction.

In FIGS. 8A-8C, four ground connection electrodes 811 are assembled on the PCB 64. The ground connection electrodes 811 are located around the inductor element 63 as shown in FIG. 8A. One or more of the ground connection electrodes 811 can be omitted if the power supply module 60 has enough static electricity resistance.

Sixth Embodiments

Figure 9A:
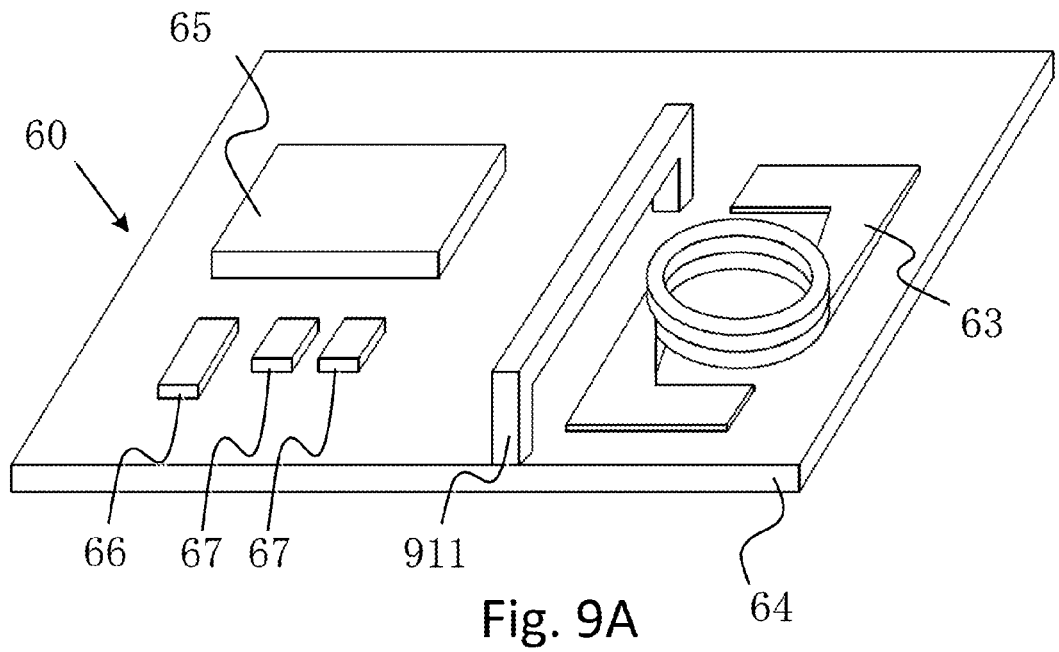
FIGS. 9A-9C are respectively: a perspective view that shows a power supply module as an intermediate product in a manufacturing process; a perspective view of the power supply module after a manufacturing process is complete; and a perspective view of another power supply module after a manufacturing process is complete. The power supply module is configured with an inductor (an air-core coil), a ground connection electrode, a printed circuit board (PCB), an integrated circuit (IC), a resistor, and a capacitor.
Figure 9B:
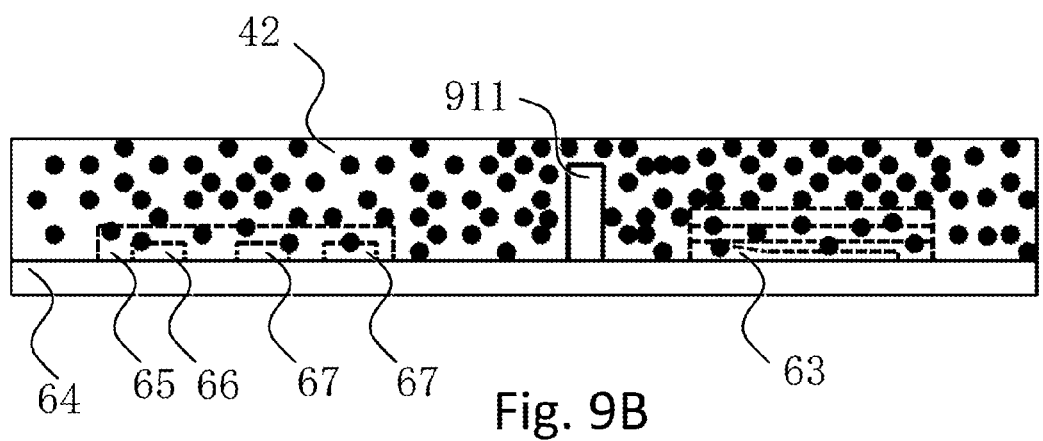
Figure 9C:
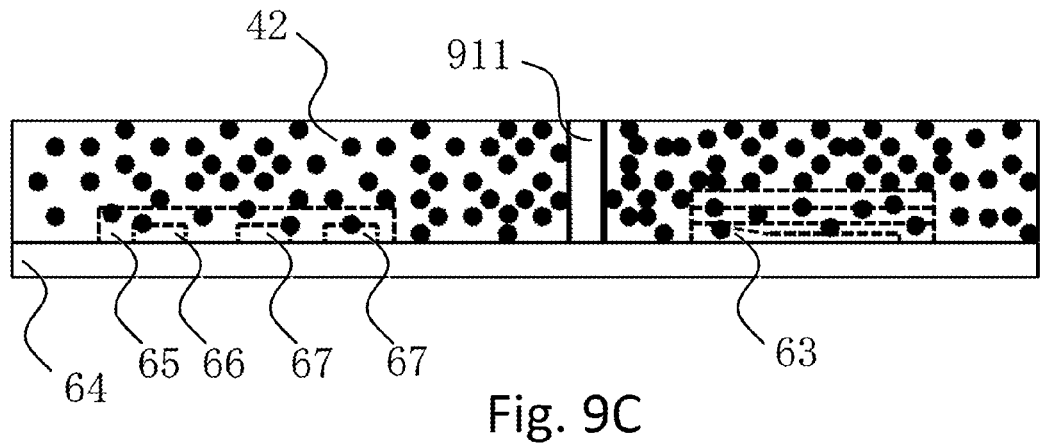

FIG. 9A is a perspective view that shows a power supply module 60 as an intermediate product in a manufacturing process. FIGS. 9B-9C are perspective views of the power supply module after a manufacturing process is complete. The power supply module 60 is configured with the inductor (an air-core coil) 63, a ground connection electrode 911, the printed circuit board (PCB) 64, the integrated circuit (IC) 65, and the passive components 66, 67 (resistor 66 and capacitors 67). The same elements shown in FIGS. 9A-9C and other drawings have the same reference numerals. The inductor element 63 can be made by the same processes as for the inductor element 1 that are shown in FIGS. 1 and 2 as explained above. Thus, detailed explanations of manufacturing the inductor element 63 are omitted here.

A difference between FIGS. 9A-9C and FIGS. 6A, 7A is a locational relationship between the ground connection electrode 911 and other components. In this embodiment, only one ground connection electrode 911 is provided. The ground connection electrode 911 is parallel to a shorter side of the PCB 64. In addition, a side vertical part of the ground connection electrode 911 located at the edge of the longitudinal side of the PCB 64 is exposed outside of the mixture 42 after the components are covered by the mixture 42 as shown in FIGS. 9B-9C. As shown in FIG. 9B, only the side vertical part of the ground connection electrode 911 is exposed and a top longitudinal part of the ground connection electrode 911 is not exposed. In contrast, as shown in FIG. 9C, both the side vertical part and the top longitudinal part of the ground connection electrode 911 are exposed to improve static electricity resistance. Note that a manufacturing process for making the power supply module 60 shown in FIGS. 9A-9C is the same as the above explanation for the power supply module 60 shown in FIGS. 6A-6C. Therefore, the sharp edge 57 of the remover 56 is slid from one of the longer side of the PCB 64 to the other longer side of the PCB 64 to remove the excessive mixture 42. The vertical side part or both the top longitudinal part and the vertical side part of the ground connection electrode 911 are exposed outside the mixture 42 as respectively shown in FIGS. 9B-9C after the components are covered by the mixture 42. The ends of the ground connection electrode 911, which are assembled and connected to the PCB 64, are connected to the ground terminal (not shown) provided inside the PCB 64 as explained above. The ground terminal is connected to the ground potential. A material and a size of the ground connection electrode 911 are the same as the ground connection electrode 11A(11B).

Seventh Embodiments

Figure 10A:
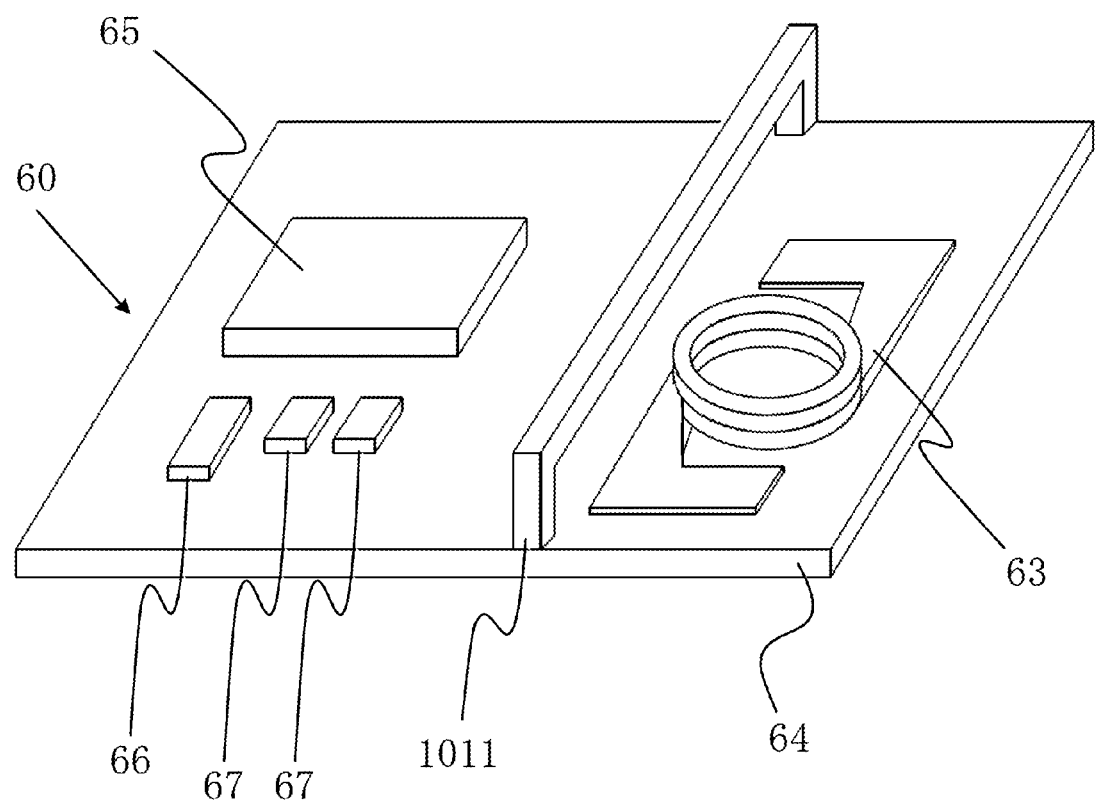
FIGS. 10A-10C are respectively: a perspective view that shows a power supply module as an intermediate product in a manufacturing process; a perspective view of the power supply module after a manufacturing process is complete; and a perspective view of another power supply module after a manufacturing process is complete. The power supply module is configured with an inductor (an air-core coil), a ground connection electrode, a printed circuit board (PCB), an integrated circuit (IC), a resistor, and a capacitor.
Figure 10B:
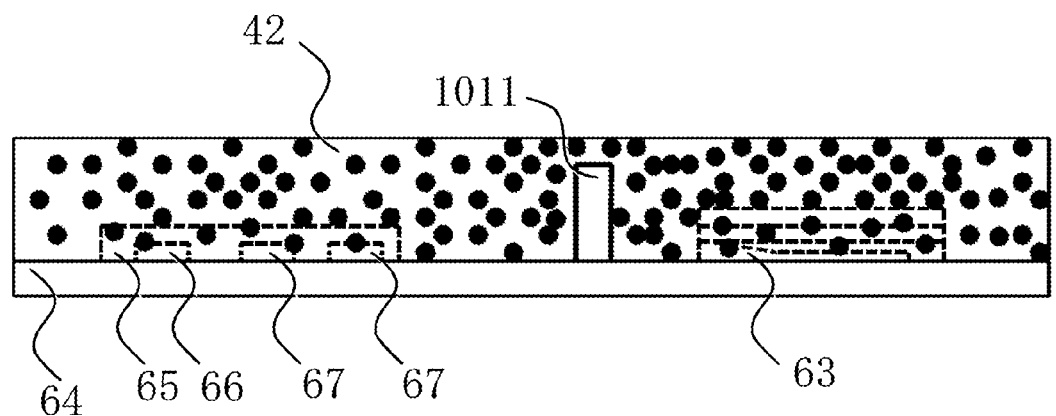
Figure 10C:
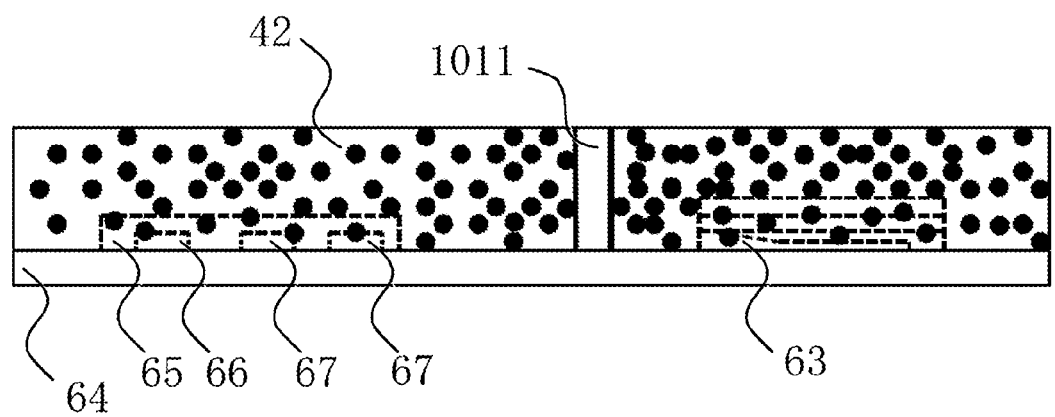

FIG. 10A is a perspective view that shows a power supply module 60 as an intermediate product in a manufacturing process. FIGS. 10B-10C are perspective views the power supply module shown in FIG. 10A after a manufacturing process complete. The power supply module 60 is configured with the inductor (an air-core coil) 63, a ground connection electrode 1011, the printed circuit board (PCB) 64, the integrated circuit (IC) 65, and the passive components 66, 67 (resistor 66 and capacitors 67). The same elements shown in FIG. 10A-10C and other drawings have the same reference numerals. The inductor element 63 can be made by the same processes as for the inductor element 1 that are shown in FIGS. 1 and 2 as explained above. Thus, detailed explanations of manufacturing the inductor element 63 are omitted here.

A difference between FIGS. 10A-10C and FIG. 9A is a locational relationship between the ground connection electrode 1011 and other components. In this embodiment, only one ground connection electrode 1011 is provided. The ground connection electrode 1011 is parallel to a shorter side of the PCB 64 in the same manner as FIG. 9A. In addition, two side vertical parts of the ground connection electrode 1011 located at the edges of the longitudinal sides of the PCB 64 are exposed outside of the mixture 42 after the components are covered by the mixture 42 as shown in FIGS. 10B-10C. As shown in FIGS. 10A and 10B, the two side vertical parts of the ground connection electrode 1011 are exposed and a top longitudinal part of the ground connection electrode 1011 is not exposed. In contrast, as shown in FIG. 10C, both the two side vertical parts and the top longitudinal part of the ground connection electrode 1011 are exposed to improve static electricity resistance. Note that a manufacturing process for making the power supply module 60 shown in FIGS. 10A-10C is the same as the above explanation for the power supply module 60 shown in FIGS. 6A-6C. Therefore, the sharp edge 57 of the remover 56 is slid from one of the longer side of the PCB 64 to the other longer side of the PCB 64 to remove the excessive mixture 42. The two vertical side parts or both the top longitudinal part and the two vertical side parts of the ground connection electrode 1011 are exposed outside the mixture 42 as respectively shown in FIGS. 10B-10C after the components are covered by the mixture 42. The ends of the ground connection electrode 1011, which are assembled and connected to the PCB 64, are connected to the ground terminal (not shown) provided inside the PCB 64 as explained above. The ground terminal is connected to the ground potential. A material of the ground connection electrode 1011 is the same as the ground connection electrode 11A(11B). A length of the top longitudinal part of the ground connection electrode 1011 is larger than the ground connection electrode 11A(11B).

The electronic component that has a coil, such as the inductor element and power supply module, and methods for manufacturing the electronic component being thus described, it will be apparent that the same may be varied in many ways. Such variations are not to be regarded as a departure from the spirit and scope of the invention, and all such modifications as would be apparent to one of ordinary skill in the art are intended to be included within the scope of the following claims.

What is claimed is:

1. An electronic component comprising:
a circuit board that includes a ground terminal connected to a ground potential;
a coil component that is assembled on the circuit board, the coil component includes a T-shaped core and an air-core coil;
a ground connection electrode that is assembled on the circuit board next to the coil component and that is connected to the ground terminal; and
a mixture of a metal composite magnetic material and a resin that is formed on the circuit board and that covers the coil component and the ground connection electrode as a package, wherein
a part of the ground connection electrode is exposed outside the mixture.

2. The electronic component according to claim 1, wherein the ground connection electrode is in a bar shape, and a tip of the ground connection electrode is exposed outside the mixture.

3. The electronic component according to claim 2, further comprising:
another ground connection electrode that is assembled on the circuit board next to the coil component and that is connected to the ground terminal, wherein
the another ground connection electrode is in the bar shape, and a tip of the another ground connection electrode is exposed outside the mixture.

4. The electronic component according to claim 1, wherein the ground connection electrode is in a rectangular arch shape, and at least one of a top and a side of the ground connection electrode is exposed outside the mixture.

5. The electronic component according to claim 4, further comprising:
another ground connection electrode that is assembled on the circuit board next to the coil component and that is connected to the ground terminal, wherein
the another ground connection electrode is in the rectangular arch shape, and at least one of a top and a side of the another ground connection electrode is exposed outside the mixture.

6. The electronic component according to claim 1, wherein the circuit board includes a plurality of board layers, and the ground terminal is provided on one of the plurality of board layers that faces another of the plurality of board layers.

7. A power supply module, comprising:
a circuit board that includes a ground terminal connected to a ground potential;
a coil component that is assembled on the circuit board, the coil component includes a T-shaped core and an air-core coil;

passive components including a capacitor and a resistor that are assembled on the circuit board;

an integrated circuit that is assembled on the circuit board;

a ground connection electrode that is assembled on the circuit board next to the coil component and that is connected to the ground terminal; and a mixture of a metal composite magnetic material and a resin that is formed on the circuit board and that covers the coil component, the passive components, the integrated circuit and the ground connection electrode as a package, wherein a part of the ground connection electrode is exposed outside the mixture.

8. The power supply module according to claim 7, wherein the ground connection electrode is in a bar shape, and a tip of the ground connection electrode is exposed outside the mixture.

9. The power supply module according to claim 8, further comprising:

another ground connection electrode that is assembled on the circuit board next to the coil component and that is connected to the ground terminal, wherein the another ground connection electrode is in the bar shape, and a tip of the another ground connection electrode is exposed outside the mixture.

10. The power supply module according to claim 7, wherein the ground connection electrode is in a rectangular arch shape, and at least one of a top and a side of the ground connection electrode is exposed outside the mixture.

11. The power supply module according to claim 10, further comprising:

another ground connection electrode that is assembled on the circuit board next to the coil component and that is connected to the ground terminal, wherein the another ground connection electrode is in the rectangular arch shape, and at least one of a top and a side of the another ground connection electrode is exposed outside the mixture.

12. The electronic component according to claim 7, wherein the circuit board includes a plurality of board layers, and the ground terminal is provided on one of the plurality of board layers that faces another of the plurality of board layers.

\* \* \* \* \*